Feb. 3, 1970 G. MESSNER ET AL 3,493,481

METHOD OF TESTING PRINTED CIRCUIT BOARDS

Filed Oct. 27, 1966

GEORGE MESSNER
RUDOLPH ARMSTRONG
DIMITRY G. GRABBE

BY Morgan, Finnegan, Durham & Pine

ATTORNEYS

United States Patent Office
3,493,481
Patented Feb. 3, 1970

3,493,481

METHOD OF TESTING PRINTED CIRCUIT BOARDS

George Messner, Sea Cliff, Rudolph John Armstrong, Hempstead, N.Y., and Dimitry G. Grabbe, Lewiston, Maine, assignors to Photocircuits Corporation, Glen Cove, N.Y., a corporation of New York Filed Oct. 27, 1966, Ser. No. 589,919
Int. Cl. B01k 5/00
U.S. Cl. 204—180 13 Claims

ABSTRACT OF THE DISCLOSURE

A process for testing a printed circuit board is provided, which comprises providing a first conductive plate and a second conductive plate, placing between said conductive plates a printed circuit board having at least one terminal on the board which is connected through at least one circuit to at least one other terminal on the board, placing between said printed circuit board and one of said conductive plates a recipient sheet and a source sheet, said source sheet being impregnated with a fluid phase containing relatively charged mobile particles of detectable material capable of electrophoretic transfer, said recipient sheet being impregnated with a liquid phase into which said particles can migrate, said recipient sheet and said source sheet being in surface-to-surface contact with each other, placing between said printed circuit board and the remaining conductive plate an overlay template which is non-conducting and which has apertures opposite selected terminals on the printed circuit board, and placing a conducting pad over said template between the template and the remaining conductive plate, establishing an electric field between said conductive plates whereby said terminals in contact with one of said sheets are energized and effects electrophoretic migration of said charged mobile particles from an origin within said source sheet to a destination within said recipient sheet, the areas in said recipient and source sheets where said migration takes place defining areas opposite energized terminals of said circuit board.

Figure 1:
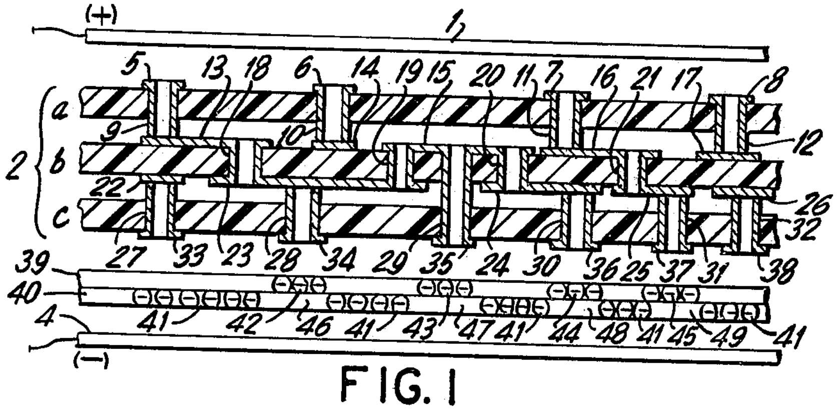

The present invention relates to a process for testing printed circuit boards employing electrophoresis to cause a visible, or otherwise detectable, material composed of particles charged with respect to their surrounding medium to be transferred from one place to another, said points of transfer indicating energized electrical terminals in a printed circuit board in contact with said materials.

The present invention relates to a process and apparatus for testing printed circuits for continuity and/or shorting to ground or power planes. In addition, the invention relates to a process for providing a visual record of the test results.

The invention relates to an electrophoretic process for testing printed circuits whereby circuit continuity is tested by making an electrical connection between selected terminals of a circuit board and an electrical conducting plate and applying a voltage potential between said plate and a second electrical conducting plate to energize terminals on the side of the printed circuit board in contact with a recipient sheet. The plates have sandwiched between them the printed circuit board and immediately beneath the circuit board a recipient sheet and in contact with said recipient sheet a source sheet containing charged mobile particles of the material capable of electrophoretic transfer.

The charged mobile particles in the source sheet, when subjected to an electric field in those areas immediately opposite the energized terminals of the printed circuit board, establish an electrophoretic migration across that sheet to cause said charged particles to transfer from said source sheet to said recipient sheet, thereby indicating a continuity of the printed circuit connected to the energized terminals.

The potential is applied for a sufficient period of time to provide a detectable color change at the point of contact of the energized terminals with the recipient sheet. The applied potential is removed and the recipient sheet removed and dried. The dried porous recipient sheet comprises a permanent record of the test. The dried recipient sheet containing the areas that are colored can easily be compared with an overlay template which has openings corresponding to terminals of the continuous circuits and it can readily be ascertained if the circuits are continuous.

The present invention specifically relates to a process for testing printed circuit boards for continuity of the printed circuits and for integrity of the circuits which comprises placing the printed circuit board in contact with a first recipient sheet having adjacent to said recipient sheet a source sheet of charged mobile particles of the detectable material. All three are placed between two parallel conducting metal plates, pressure is applied to said plates to bring the plates, the printed circuit boards, the recipient sheet and the source sheet into intimate contact. The various materials form a sandwich comprising the two metal plates having in between, as the uppermost layer, the printed circuit board, as the next layer the recipient sheet, and the next layer the source sheet. An electric potential is applied between said conducting plates. An electric current flows through the exposed conducting terminals at the top of the circuit board, through the printed circuits, to the connecting terminals on the bottom surface of the printed circuit board, energizing these bottom terminals which are in direct contact with the recipient sheet. There is thereby established an electrophoretic migration across said sheets from the source sheet to the recipient sheet of the charged particles and a detectable color change occurs in said recipient sheet at points immediately opposite the energized terminals. There is no change in color in the recipient sheet for those terminals on the bottom of the circuit board in contact with the recipient sheet for which there are no electrical connections through the circuit board to a terminal on the top of the board in contact with said metal conducting plate.

More specifically, the present invention relates to a process and apparatus for testing multilayer printed circuit boards having one or more printed circuits on an intermediate layer printed circuit board, which circuits have at least one terminal on the top of the board in contact with said metal conductor and at least one terminal on the bottom of the board in contact with said recipient sheet; the circuits being covered by an outer insulating layer. Electrical contact of at least one terminal on the top of the board with an electric source of one potential energizes the terminals at the bottom of the board for those circuits that are continuous and placing an electric source of opposite potential opposite said energized terminals establishes a potential gradient across the recipient and source sheets whereby the charged mobile particles of detectable material migrate by electrophoretic transfer from said source sheet to said recipient sheet.

The object of this invention is to provide a technique for performing functional electrical continuity and/or shorting to ground or power planes testing at a minimum cost and time and in addition to provide a permanent visual record of the test results.

Single-sided or two-sided printed circuit boards can be visually checked for circuit continuity. Also, circuit boards carrying relatively simple circuit patterns can easily be visually or electrically checked for circuit continuity. A major problem arises with circuit boards coated with insulating materials and/or circuit boards coated with protective insulating layers adhesively bonded thereto which obscure the underlying circuit patterns. A more serious problem arises when attempting to test multilayer printed circuit boards containing several boards having circuit patterns on either or both sides of the boards. The printed circuits on the boards may be interconnected to each other by various plated through holes or other connecting means. Boards of this type cannot be visually checked because of the relative opaqueness of the intermediate and overlaying insulating boards and because of the complexity of the circuitry involved. Also where a relatively complex circuit board is involved there is a multitude of circuits which interconnect within the board between various terminal points. Testing circuit boards of this type by conventional means requires relatively skilled personnel and relatively extensive periods of time.

The majority of electrical interconnections and multilayer printed wiring boards are made on internal encapsulated layers. Therefore, in contrast to the single-sided or two-sided circuit boards, the continuity and integrity of such interconnections cannot be ascertained by visual inspection. The most frequent method used for testing multilayer printed wiring boards to insure that all required internal interconnections between terminal areas exist is to subject such boards to functional electrical continuity tests. In addition, such multilayer printed circuit wiring boards may contain one or more ground and/or power distribution planes which are connected only to selected terminal areas of the board, but must by-pass other terminal areas of the board which are carrying other electrical signals. The functional electrical testing is used also to assure this characteristic of the multilayer printed wiring board.

The conventional functional test procedure is usually performed by applying voltage through probes to outer terminals which are connected to the internal interconnected circuits and if continuity exists, a suitable signal will so indicate. To direct the operator a suitable visual aid or interconnection wiring list is utilized. Another method of functional electrical testing is to utilize numerically controlled machines and suitable jigs, which will energize desired electrical paths in sequence and record the results. The disadvantages of both of those methods are that they are either tedious and time consuming or that the programming and equipment required are very expensive and complicated so that relatively skilled personnel are required to carry out the tests. Further, the prior art procedures do not readily provide an inexpensive permanent record of the tests carried out.

In accordance with the present invention, an electric field is imposed between two conducting plates of opposite potential. The top conducting plate provides electric current to the terminals on the top of the printed circuit board through the printed circuit board for the circuits that are continuous to the terminals on the bottom of the circuit board, thus energizing those terminals on the bottom of the circuit board in contact with a recipient sheet and establishing electrophoretic migration across said receipient and source sheets to cause said charged particles to transfer from said source sheet to said recipient sheet at points opposite the energized terminals of the printed circuit board. The bottom conducting plate is placed opposite the outer face of the source sheet.

The electrophoretic migration from the source sheet causes a distinctive change in color in said recipient sheet at the points opposite said energized terminals thereby clearly indicating which terminals are energized and which terminals are not. The source sheet correspondingly has an area devoid of or lighter in color in those areas from which the charged particles have migrated. The recipient and/or source sheets can be dried and maintained as a permanent record of the test carried out.

In a similar manner, the top conducting plate can be isolated from all of the terminals on the top of the printed circuit board except selected terminals to be tested by using a suitable insulating template and allowing the top conducting plate only to come into contact with the particular terminals it is desired to have tested. In order to test the integrity of a printed circuit board to determine, for example, whether or not there is shorting between specific circuits, circuits and ground planes or circuits and power planes, a template can be used to insulate the top conducting plate from all the terminals on the top of the board, except, for example, a selected terminal connected to a ground plane or power plane. Where the only terminal in contact with the conducting plate is one connected to a ground plane, the circuits can be tested for shorting to the ground plane. Since all of the terminals on top of the circuit board are insulated from the conducting plate, only those terminals on the bottom of the board which are intentionally connected to the ground plane or are shorted to ground will give a color indication. A potential is applied as before and points in the circuit board which are connected to the ground plane by means of an internal short, or intentionally, will energize a circuit connected to one of the bottom terminals and an electrophoretic migration of charged mobile particles of detectable material will take place and transfer colored particles from the source sheet to the recipient sheet at the points of contact of the energized terminals and the recipient sheet. An overlay template which has holes cut opposite the terminals which should not be connected can be placed over the recipient sheet after the test and any shorted circuits readily found.

The process of this invention does not require any electric current as such to pass through the recipient sheets or the source sheet nor does it require a chemical reaction to take place between the terminals and the recipient sheet or the terminals and the charged mobile particles. The color change obtained is produced solely by the charged mobile particles of detectable material moving from the source sheet to the recipient sheet by electrophoretic migration. When the detectable material has migrated into said recipient sheet, there is a distinctive color change at the points in the recipient sheet the mobile charged particles have selectively migrated into said recipient sheet.

The process of this invention depends upon the fact that relatively charged particles in a fluid phase may be caused to move in an electric field in a direction which depends on the sign of the relative charge. The relative charge may result by the particles themselves being charged, e.g. charged ions or colloids or from the presence of a charged medium surrounding neutral particles; thus, if a source sheet with a liquid containing mobile charged particles of one potential is put next to a wet recipient sheet and an electrode of opposite potential is placed in contact with the outside face of the recipient sheet, the particles will be transferred from the source sheet to the recipient sheet.

The material to be transferred generally consists of charged mobile particles of detectable materials, for example, colored dyes. Many dyes exist in solution as charged particles which are susceptible to electrophoretic migration. In addition, materials which exist in solution or dispersion as charged partcles, although colorless in themselves, can be made to react to produce a colored product by providing in the recipient sheet a material which changes color when the charged particle passes from the source sheet to the recipient sheet and the two materials are brought together.

The rate of transfer of the charged particles depends on the potential gradient the charged particle is being subjected to and the charge of the particle being transferred and may be quite rapid if high voltages are employed. The current required on the other hand for all practical purposes is only that exceedingly small amount represented by the net charge transferred.

The process of this invention can be carried out with the energized terminals of the printed circuit board being tested being either a positive or a negative potential; whether positive or negative voltage is used will depend upon the charge on the charged mobile particles of detectable material which are to be transferred into the recipient sheet.

The source sheet, however, is generally the sheet placed adjacent to one of the conducting plates and the recipient sheet is placed between the source sheet and the printed circuit board to be tested. If the source sheet contains negatively charged particles, then the energized terminals on the printed circuit board would be positively charged and would attract the negative charged color material from the source sheet into the recipient sheet. On the other hand, it is obvious that the source sheet can be placed adjacent to the energized terminals of the printed circuit board and the recipient sheet placed in contact with the conducting plate. If the charged particles of the source sheet are negative, then a negative charge would be put on the energized printed circuit terminals of the printed circuit board and the negative charged mobile particles in the source sheet would be repelled from the energized terminals and would migrate into the recipient sheet.

The mobility of the particles which is required for transfer by electrophoretic transfer in the process of this invention is easily provided by providing a fluid medium in the source sheet contiguous with a fluid medium in the recipient sheet. Generally, the source sheet will contain a solution or dispersion of an ionic dye or other detectable charged material and the recipient sheets will contain a solvent or other liquid in which the particles are mobile. In both the source sheet and the recipient sheets, the liquid phase exists as a continuous phase extending through the source and recipient sheets.

The process of this invention results in a substantial saving in time, obviates the need for expensive equipment and the need for relatively highly skilled personnel to carry out the testing of printed circuits for circuit continuity and possible shorts to ground and/or power planes in a substantially shorter time than has heretofore been possible to be carried out. The process of this invention is simple, economical and practical, thus saving both time and expense in checking printed circuits. The process has particular application to complex multilayer printed circuit boards, which heretofore have required tedious and time consuming procedures for carrying out the testing of the circuits in the board.

Various representative systems in which the methods of this invention may be used are described in greater detail below with reference to the accompanying drawings, in which:

FIGURE 1 is a schematic representation of an expanded cross section of a relatively simple multilayer printed circuit board which is arranged to check circuit continuity between terminals on the top of the circuit board which are in contact with a power source and terminals on the bottom of the board which are energized thereby and are in contact with a recipient sheet, which sheet is in turn in contact with a source sheet. Below the source sheet is a second metal conductor or electrode of opposite polarity to that at the top of the printed circuit board.

Figure 2:
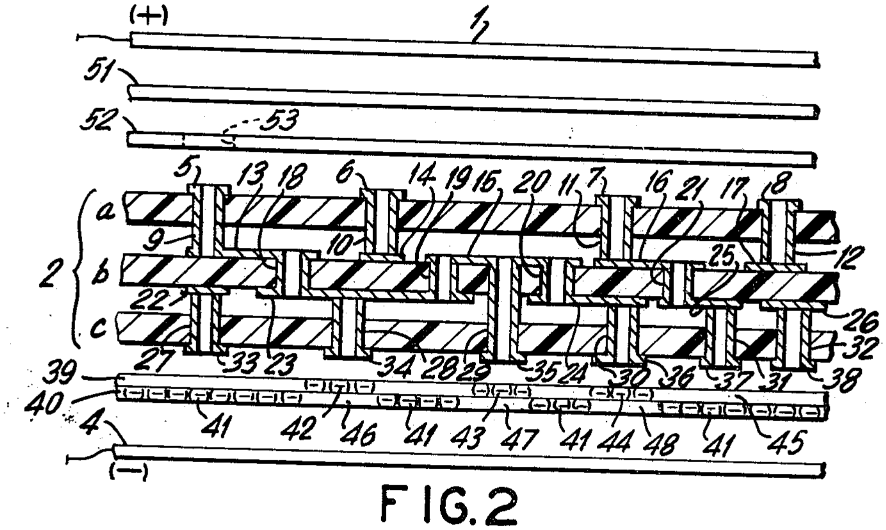

FIGURE 2 is a schematic representation of an expanded cross section of a simple multilayer printed circuit board of the same configuration as that in FIGURE 1 which is set up to check a selected printed circuit by using a non-conducting template which insulates the undesired circuits and only allows contact with the particular circuit to be tested. There is also shown a flexible conducting pad which provides a means for obtaining good electrical contact between the metal conductor through the hole in the template to the particular terminal to be tested.

Figure 3:
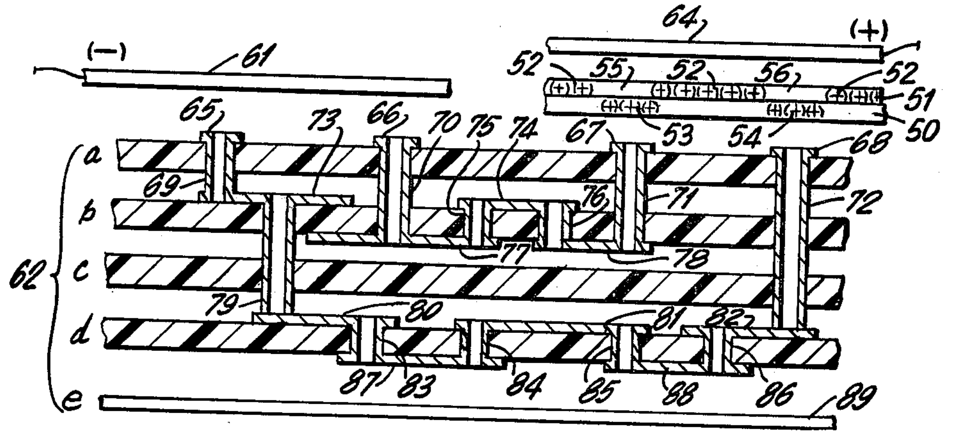

FIGURE 3 is a schematic representation and expanded cross section of a relatively simple multilayer printed circuit board which has the terminals to be tested all on the top of the board and shows a procedure whereby selected terminals are contacted with a metal conductor on the top of the board and other selected terminals are contacted with a recipient sheet. The recipient sheet is in contact with a source sheet which source sheet is in contact with a second metal conductor also on the top of the board, whereby selected circuits in the printed circuit board can be tested.

The printed circuit boards that can be tested in accordance with the present invention are printed circuit boards having only a single board with circuits on one or both sides and multilayer boards with more than one board having printed circuits on one or both sides sandwiched between insulating boards and adhesively bound to each other. The various circuits within the board may be connected to each other by plated through holes in the board to terminals on the top or bottom surface of the board and to ground planes or power planes. Selected circuits can be checked out or short circuits can be checked out by insulating the terminals in one area of the board from the conducting plate by using an insulating overlay template which has cut in the template holes corresponding to terminals that it is desired to test.

The terminals can be coated with a protective lead-tin solder, nickel, tin, gold or lead mask. The process of this invention does not require that the terminals interact in any way with the recipient layer or the color indicator material. All that is required is that the terminals be in contact with or close to the recipient sheet to establish an electrophoretic field of sufficient strength to provide for migration of the charged mobile particles of detectable material. Generally, both the recipient sheet and the source sheet are impregnated with a liquid phase, for example, distilled water or an aqueous solution of a weak electrolyte to provide the medium through which the charged mobile particles migrate. Generally, a salt of any inorganic acid can be used. Specific salts that can be used are potassium, nitrate, sodium chloride, potassium sulfate and the like. City tap water can also provide a suitable medium. The electrolytes, when used, are used in relatively weak solutions.

In some situations a source sheet can contain a dye which is itself colorless but which reacts with a material in the recipient sheet to form a colored material or the source sheet can contain a charged colored material which on migrating to the recipient sheet colors the recipient sheet.

The paper selected for use is not critical; suitable papers are the Watman filter papers which are densely packed and which have a majority of fibers oriented perpendicular to the surfaces of the paper. This type of paper can be used both as a source sheet and a recipient sheet. By having the fibers oriented perpendicular to the surfaces of the paper, the migration of the charged particles of detectable material is directly from one sheet into the other sheet and there is little tendency for the charged particles to spread in the recipient sheet. This results in a sharp color indication being obtained.

By using the process of this invention it is possible to suitably program points which are to be energized to obtain a record of the existence or non-existence of a continuous path between desired terminal areas or to establish if any terminal areas have internal circuits shorted to other circuits, shorted to ground and/or power planes.

Colored charged particles which are suitable for use in this invention may be readily selected from dyes that are commercially available. The table below sets forth several commercial dyes which can be used. Distilled water is a suitable liquid phase and Watman 3M electrophoresis paper can be used as the source and recipient sheets.

The source sheet is normally saturated with an aqueous solution of the charged mobile particles of detectable material.

TABLE.—SUITABLE DYE MATERIALS

| No. | Mfg. Desig. | Mfr. | C.I. No. | Charge |
|---|---|---|---|---|
| 1 | Pontacyl Red Rubine R Crude Ground | DuPont | 14720 | A |
| 2 | Pontacyl Carmine 6B Extra Conc. 125% | do | 18055 | A |
| 3 | FDC Red No. 4 | | | A |
| 4 | Pontacyl Blue-Black SX | DuPont | 20470 | A |
| 5 | Pontamine Fast Turquoise 8GLD conc. 150% | do | 74180 | A |
| 6 | Pontamine Black "E" Double | do | | A |
| 7 | Capracyl Yellow NW | do | | A |
| 8 | Methyl Violet B | | | C |
| 9 | Brilliant Green Crystals | DuPont | 42040 | C |
| 10 | Sevron Blue 76 | do | | C |
| 11 | Ink Violet B | do | | C |

It will be noted from the above listed materials that there are many readily available dyes of different colors which can be used for carrying out any particular tests and to obtain a permanent record of any desired color or colors.

In another embodiment of the present invention, systems employing two or more chemicals can be used. Each of the chemicals can themselves be relatively colorless and on being brought into contact with each other form a highly colored material or if colored when brought into contact with each other drastically change color.

The chemicals are selected so that at least one of them is a relatively charged mobile particle relative to its surroundings.

The following pairs of chemicals constitute suitable indicator systems:

(1) Beta-resorcylic acid on one sheet and ferro-bromosulfite on the other sheet.

(2) Ammonium salt of nitrosophenyl hydroxylamine on one sheet and phenyl hydrazine on the other sheet.

(3) Ferric sulfite on one sheet and ammonium salt of nitrosophenyl hydroxylamine on the other sheet.

In this embodiment of the invention, one of the chemicals is used to impregnate one sheet and the other to impregnate the other sheet. The two sheets are placed face to face as before and placed between one side of a printed circuit board to be tested and a conducting metal plate. The other conducting plate is placed on the other side of the printed circuit board.

An electrical potential is applied between said conducting plates, energizing the terminals in the printed circuit board on the side in contact with one of said sheets, establishing an electrophoretic migration of at least one of said materials from one of said sheets into the other sheet, in the areas in the sheet immediately opposite said energized terminals. The migration of one of the chemicals from one sheet into the other sheet forms in the second sheet a highly colored chemical compound and/or chemical complex compound. The highly colored area indicate those continuous electrical connections through internal circuits in the board to terminals on the top of the board in electrical contact with the top conducting plate.

The voltage applied to establish the electrophoretic migration of the charged particles will vary with the particular circuit being tested, whether the test is for circuit continuity or for checking shorts or checking insulation break down. The voltage is not critical so long as it is high enough to carry out the desired transfer of charged particles and so long as it is not so high as to cause short circuiting between circuits in the board and through the source and recipient sheets to the conducting plate. The applied voltage can vary from about one volt to 400 volts but more generally is in a range of 15–50 volts.

The current employed is only that amount of current that is required to provide for the transfer of the charge particles from the source sheet to the recipient sheet. There is generally an initial indication of a current as the charged particles migrate, which rapidly drops off.

The recipient sheet is normally saturated with an aqueous solution of a dilute electrolyte. The electrolyte can be used in 0.05 M to about 1 M solutions. The electrolyte concentration is not critical since the charge particles migrate by electrophoretic transfer which is due to the establishment of the electric field and does not require any electrolytic means or transfer of current to obtain the migration of the charged particles. The moisture content of the source sheet and recipient sheet is sufficient so that there is a continuous liquid medium between the two sheets whereby the charged mobile particles can easily migrate from one sheet to the other.

Where selected circuits are to be tested and an overlay template is used with holes corresponding to selected terminals of the circuit board to be tested, the template material is such that it is insulating and non-conducting and such that there is no electrical current passed through the template from the conducting plate to non-selected terminals which it may be in contact with. Also where the template is used there is normally used a conductive pad to provide good electrical contact through the thickness of the insulation template between the conducting metal plate and the particular terminals of the printed circuit board to be contacted. A graphite impregnated felt pad can be used or a relatively fine steel wool can be used to bridge the distance of the thickness of the template and to assure good electrical contact.

The test is carried out for a sufficient period of time so that a sufficient amount of the charged mobile particles of detectable material migrate by electrophoretic transfer from the source sheet to the recipient sheet to obtain a detectable color change in the recipient sheet. The time will depend on the specific mobility of the charged particles and the voltage applied. The temperature at which the test is carried out is normally ambient temperature though higher or lower temperatures can be utilized for carrying out specific desired tests.

The process of the invention is illustrated and may be better understood with reference to the following examples examples which are discussed with reference to particular figures of the drawings.

Example 1

A procedure for testing printed circuits employing the printed circuit of FIGURE 1 will be described. FIGURE 1 is a multilayer printed circuit board having an upper layer 2*a*, a lower layer 2*c* and an intermediate layer 2*b*. Intermediate layer 2*b* contains on the top surface of the layer printed circuits 13, 14, 15, 16 and 17 and on the bottom surface circuits 22, 23, 24, 25 and 26. Connections between the top and bottom of printed circuit board 2*b* are made by plated through holes 18, 19, 20 and 21. Connections between the printed circuits and the top terminals of the printed circuit board are made by plated through holes 9, 10, 11 and 12. In a similar manner connections to terminals on the bottom of the printed circuit board are made by plated through holes 27, 28, 29, 30, 31 and 32. A source sheet 40 impregnated with an aqueous solution of a negatively charged dye 41 is placed adjacent to recipient sheet 39 which is impregnated with water and the two sheets are placed on a metal conductor plate 4. The multilayer printed circuit board 2 to be tested is placed on top of the recipient sheet 39 and on top of the printed circuit board is placed a second metal conductor plate 1. The four layers are brought into intimate contact. Plate 1 is the anode and plate 4 the cathode. A sufficient potential voltage, e.g. 15–30 volts, is applied between metal conductor plate 1 and metal conductor plate 4 for a sufficient time to obtain a color transfer, e.g. 60 seconds. This energizes the circuits in the printed circuit board having complete connections between the top of the board and the bottom of the board, for example, terminal 5 and terminal 7 which are connected through internal printed circuits to terminals 34, 35, 36 and 37 respectively. The lower terminals 34, 35, 36 and 37 are energized and an electric field is imposed between these terminals and the lower metal conductor plate 4. The energized terminals have a plus polarity whereas the lower metal plate has a negative polarity. An electrophoretic migration is thereby established across said source and recipient sheets to cause said negatively charged particles 41 from said source sheet 40 to transfer from said source sheet to said recipient sheet 39. The electrophoretic migration causes the recipient sheet 39 to drastically change color, the color being the color of the charged dyed particles, at areas 42, 43, 44 and 45 immediately opposite the energized terminals 34, 35, 36 and 37 respectively.

The source sheet 40 is a sheet of Watman No. 1 filter paper impregnated with an aqueous solution containing 2% by weight of FDC Red No. 4 dye and the recipient sheet 39 is a sheet of Watman No. 1 filter paper impregnated with a 0.1 mole solution of potassium chloride. These two sheets are placed in face-to-face contact as described above and the terminals energized from a suitable power source.

On separation of the recipient sheet from the printed circuit board a distinct image in the recipient sheet is observed corresponding to the terminals of the printed circuit board for which there are continuous electrical connections through various connecting circuits in the intermediate layers of the printed circuit board to terminals on the top of the printed circuit board. A positive image is obtained in the recipient sheet and whitened areas 46, 47, 48 and 49 or negative image is obtained in the source sheet.

Example 2

Example 2 is carried out with reference to FIGURE 2 of the drawings wherein the printed circuit board being tested and the source and recipient sheets were the same as in Example 1, the primary difference being that of an overlay insulating member template 52 which has an aperture 53 cut out above terminal 5 in printed circuit board 2. Between the overlay template and the upper metal conducting plate 1 is a conducting graphite impregnated felt pad 51 so that when the various layers are brought into contact, the conducting felt pad 51 bridges the area of thickness of the template 52, thereby providing good electrical contact between the upper metal plate 1 and terminal 5 of printed circuit board 2.

A source sheet 40 and recipient sheet 39 are used in the same manner as described in Example 1. The various layers are brought into intimate contact and voltage is applied across plates 1 and 4. Since only terminal 5 is contacted with the power source the terminals that are energized in the lower printed circuit board are 34, 35 and 36. Lower terminal 37 is not energized because the upper terminal 7 is not contacted with the upper metal conducting plate 1. Therefore, only areas 42, 43 and 44 of the recipient sheet 39 are colored. These are the areas immediately opposite the energized terminals 34, 35 and 36 of the printed circuit board. Since terminal 37 was not energized, there is no electrophoretic migration of charged particles to area 45 of the recipient sheet.

In this manner the testing of the continuity of selected internal printed circuits can be carried out in any desired order.

Example 3

Example 3 is carried out with reference to FIGURE 3 of the drawings. In this example positively charged mobile particles 52 of detectable material are used, e.g. methyl violet B. The source sheet 51 is impregnated with a 2% by weight solution of the dye. Recipient sheet 50 is saturated with water to provide mobility of the charged material of detectable color. The source sheet is saturated with the dye solution. The primary differences between this example and the previous two examples are that a positively charged dye is used and the circuits to be tested all have their terminals on the top of the printed circuit board. For example, terminals 65 and 66 connect through various intermediate printed circuits in the printed circuit board to terminals 67 and 68. The continuity of these circuits can be tested by using two metal conductive plates 61 and 64 which are separated and of opposite electrical polarity and having interposed between plate 64 and selected energized terminals 67 and 68 a recipient sheet 50 and source sheet 51. In this example, as stated above, the source sheet 51 contains positively charged dye particles 52 and the metal conductor 64 in contact with it is positively charged. The energized terminals 67 and 68 of the printed circuit board 62 become negatively charged if the internally connecting printed circuits are continuous to the terminals 65 and 66 which are in contact with negatively charged plate 61. When a potential voltage of 10–40 volts is applied the positively charged particles 52 migrate from source sheet 51 to recipient sheet 50 giving a distinct color indication in recipient sheet 50 in those areas 53 and 54 immediately opposite energized terminals 67 and 68 respectively. As before areas 55 and 56 become whitened due to the migration of the dye particles out of the source sheet.

Example 4

In this example the procedure carried out in accordance with Example 2 is generally followed with the exception that the printed circuit board is tested for shorting as well as continuity between specific circuits. This example will be discussed with reference to FIGURE 2 of the drawings.

In this example all of the terminals on the printed circuit board are copper. A source sheet 40 and recipient sheet 39 are used in the same manner as in Example 2. The source sheet is saturated with a 4% solution of Pontacyl Blue-Black SX. The recipient sheet is saturated with a 0.1 M solution of potassium chloride.

This test is programmed to test for a short circuit between circuits 13 and 22, 16 and 17. and continuity of circuits 13 and 23. This is done simply by preparing an overlay template similar to 52 which has openings only opposite terminals 5 and 8. A second overlay template is placed between board 2*c* and the recipient sheet 39. This second template has openings only opposite terminals 33, 34 and 37. A conducting graphite impregnated felt pad 51 is placed between the template 52 and conducting plate 1.

The power is turned on and a sufficient potential is applied across plates 1 and 4 for a sufficient period of time to establish an electric field and electrophoretic migration of the charged mobile dye particles from the source sheet 40 into the recipient sheet 39.

The conducting plate 1 has a positive polarity. Therefore any terminals on the bottom of the printed circuit board that have continuous internal connections to the top of the printed circuit board would also have a positive polarity. The conducting plate 4 has a negative plurity, The charged mobile dye particles, Pontacyl Blue-Black SX, are negatively charged and when the power is turned on migrate from source sheet 40 into recipient sheet 39 and drastically change the color of the recipient sheet in those areas immediately opposite the energized terminals in contact with the recipient sheet.

In this test there is no observed color change in the areas in the recipient sheet opposite terminals 33 and 37 and there is an observed color change only opposite terminal 34.

This test indicates that there are no short circuits between circuits 13 and 22 or between 17 and 16 and that circuits 13 and 23 are continuous.

After the test the recipient sheet can be removed, dried, and used as a permanent record of the test.

The above procedures can also be used for checking shorts to ground planes and power planes and continuity to ground and power planes. The above described procedures can be carried out separately or in any desired combination.

The above examples are only given as illustrative of the inventive concept of the invention and are not intended to limit the scope of the invention in any manner.

The process of the present invention allows rapid testing of multilayer printed circuit boards and provides a permanent record of the test carried out. The process of this invention does not require any chemical reaction to take place between the energized terminals and the recipient sheet on which the test indication is recorded. Substantial savings in time and effort and in expensive equipment are realized by using the process of the present invention.

In accordance with the present invention, any type or size of printed or multilayer printed circuit board can be easily and efficiently tested for continuity and integrity of the printed circuits using a minimum of time and at a mnimum expense. The programming of the tests to be carried out is provided by merely using one or more suitable dielectric templates with apertures opposite selected terminals to be tested, and the test results readily evaluated by using overlay templates for the test sheets with apertures corresponding to areas which should be colored or not colored, if the circuit boards contain all the desired completed circuits and are free of shorts respectively.

This invention has been described with reference to the preferred embodiments and it is expected that obvious modifications will occur to those skilled in the art. Such modifications may be made without departing from the scope of this invention. The variations and combinations which occur to those skilled in the art are intended to be covered. One such modification would be to use a single sheet of paper and have the charged mobile particles coated or impregnated on one side of the paper only. This modification is intended to be covered by the present claims The scope of the invention should only be interpreted in light of the appended claims.

Having thus described the invention in detail with reference to preferred embodiments, we claim and desire to secure by Letters Patent the following:

What is claimed is:

1. A process for testing a printed circuit board which comprises providing a first conductive plate and a second conductive plate, placing between said conductive plates a printed circuit board having at least one terminal on the board which is connected through at least one circuit to at least one other terminal on the board, placing between said printed circuit board and one of said conductive plates a recipient sheet and a source sheet, said source sheet being impregnated with a fluid phase containing relatively charged mobile particles of detectable material capable of electrophoretic transfer, said recipient sheet being impregnated with a liquid phase into which said particles can migrate, said recipient sheet and said source sheet being in surface-to-surface contact with each other, placing between said printed circuit board and the remaining conductive plate an overlay template which is nonconducting and which has apertures opposite selected terminals on the printed circuit board and placing a conducting pad over said template between the template and the remaining conductive plate, establishing an electric field between said conductive plates whereby said terminals in contact with one of said sheets are energized and effects electrophoretic migration of said charged mobile particles from an origin within said source sheet to a destination within said recipient sheet, the areas in said recipient and source sheets where said migration takes place defining areas opposite energized terminals of said circuit board.

2. The process of claim 1, wherein said recipient and source sheets are one and the same sheet and said charged mobile particles are on one side of said sheet and the other side of said sheet, prior to the application of said electric field, is substantially free of charged mobile particles.

3. The process of claim 1, wherein the printed circuit is tested for shorts between at least one of the following: two or more circuits, circuits and ground planes, circuits and power planes.

4. The process of claim 1, wherein the recipient sheet is adjacent to said printed circuit board and said source sheet is adjacent to one of said conductive plates and electrophoretic migration of said charge particles takes place from said source sheet to said recipient sheet causing a sharp change in color of the paper immediately opposite the points of contact of said energized terminals.

5. A process for testing the continuity and integrity of a printed circuit board which comprises providing a first conductive plate and a second conductive plate, placing between said conductive plates a printed circuit board having at least one terminal on the board which is connected through at least one circuit to at least one other terminal on the board, placing between said printed circuit board and one of said conductive plates a recipient sheet and a source sheet, said source sheet being impregnated with a fluid phase containing relatively charged mobile particles of detectable material capable of electrophoretic transfer, said recipient sheet being impregnated with a liquid phase into which said particles can migrate, said recipient sheet and said source sheet being in face-to-face contact with each other, placing between said printed circuit board and the remaining conductive plate an overlay template which is non-conducting and which has apertures opposite selected terminals on the printed circuit board and placing a conducting pad over said template between the template and the remaining conductive plate, establishing an electric field between said conductive plates whereby said terminals in contact with one of said sheets are energized and effects electrophoretic migration of said charged mobile particles from an origin within said source sheet to a destination within said recipient sheet, the areas in said recipient and source sheets where said migration takes place defining areas opposite energized terminals of said circuit board which are in contact with one of said sheets.

6. The process of claim 5, wherein said recipient sheet is in contact with the terminals of said printed circuit board and said source sheet is in contact with one of said conductive plates.

7. The process of claim 5, wherein said source sheet is in contact with the terminals of said printed circuit board and said recipient sheet is in contact with one of said conductive plates.

8. The process of claim 5, wherein the color change is caused by charged dye particles migrating from said source sheet to said recipient sheet.

9. The process of claim 5, wherein the color change is caused by a relatively charged particle migrating from said source sheet to said recipient sheet and forming in the recipient sheet, with a material contained therein, a highly colored compound.

10. An electrophoretic procedure for testing a printed circuit board for circuit integrity and continuity which comprises placing said circuit board into contact with a recipient sheet containing a liquid phase, placing said recipient sheet in face-to-face contact with a source sheet, said source sheet having dispersed therein relatively charged mobile particles of detachable material capable of electrophoretic migration, placing the circuit board and source and recipient sheets between first and second conducting plates, placing between said printed circuit board and the first conductive plate an overlay template which is nonconducting and which has apertures opposite selected terminals on the printed circuit board and placing a conducting pad over said template beween the template and the first conductive plate, applying an electrical potential across said conducting plates whereby an electric field is established between the terminals in contact with said recipient sheet and said second conducting plate, thereby effecting electrophoretic migration of said charged particles from an origin within said source sheet to a destination within said reipient sheet, causing a color change in said recipient sheet at the points immediately opposite the points of contact of the terminals.

11. The process of claim 10, wherein the terminals on the printed circuit board in contact with said recipient sheet act as anodes.

12. The process of claim 10, wherein the terminals on the printed circiut board in contact with said recipient sheet act as cathodes.

13. An electrophoretic process for testing multilayer printed circuit boards for internal short circuits which comprises placing said circuit board into contact with a recipient sheet containing a liquid phase, placing said recipient sheet in face-to-face contact with a source sheet, said source sheet having dispersed therein relatively charged mobile particles of detectable material capable of electrophoretic migration, placing the circuit board and source and recipient sheets between two conducting plates, placing above said printed circuit board an insulating overlay template containing apertures only opposite terminals which are intended to be connected by internal printed circuits to terminals on the other side of the printed circuit board, placing over said template, between the template and one of said conducting plates, a conducting pad, applying an electrical potential across said conducting plates whereby an electric current flows from one of the conducting metal plates through the terminals on one side of the printed circuit board in contact with the conducting pad, through at least one internally shorted printed circuit in the board connected to said terminals, to terminals on the other side of said circuit board which are in contact with said recipient sheet, thereby energizing said terminals and establishing an electric field between said energized terminals and said second conducting plate and causing an electrophoretic migration of said charged particles from said source sheet into said recipient sheet, whereby there is a change in color immediately opposite the point of contact of said terminals having continuous internal circuits and said recipient sheet indicating which internal circuits are shorted.

References Cited

UNITED STATES PATENTS

| | | | |
|---|---|---|---|
| 2,358,839 | 9/1944 | Wagner | 204—2 |
| 2,642,481 | 6/1953 | Wilson | 324—66 XR |
| 3,145,156 | 8/1964 | Oster | 204—18 XR |
| 3,310,479 | 3/1967 | Goldstein et al. | 204—2 |
| 3,372,102 | 3/1968 | Lennon | 204—181 |
| 3,396,335 | 8/1968 | Burr et al. | 324—51 |

HOWARD S. WILLIAMS, Primary Examiner

G. L. KAPLAN, Assistant Examiner

U.S. Cl. X.R.

204—1; 324—51, 52